United States Patent
Samuelson et al.

(10) Patent No.: US 6,697,753 B2
(45) Date of Patent: Feb. 24, 2004

(54) METHODS AND APPARATUS FOR TESTING ELECTRONIC DEVICES

(75) Inventors: Gordon M. Samuelson, Lake Villa, IL (US); Jack Edward Weimer, Grayslake, IL (US)

(73) Assignee: Eagle Test Systems, Inc., Mundelein, IL (US)

( * ) Notice: Subject to any disclaimer, the term of this patent is extended or adjusted under 35 U.S.C. 154(b) by 115 days.

(21) Appl. No.: 10/047,506

(22) Filed: Jan. 15, 2002

(65) Prior Publication Data

US 2003/0135343 A1 Jul. 17, 2003

(51) Int. Cl.[7] .................. G01R 27/28; G01R 19/00; G01R 31/28
(52) U.S. Cl. ................ 702/117; 324/76.11; 714/733
(58) Field of Search .......................... 702/117, 57, 64, 702/65; 324/76.11; 714/733, 734, 724

(56) References Cited

U.S. PATENT DOCUMENTS

| | | | |
|---|---|---|---|
| 5,764,655 A | * | 6/1998 | Kirihata et al. ............. 714/733 |
| 5,859,119 A | * | 1/1999 | Hoefflin ....................... 524/494 |
| 6,035,237 A | * | 3/2000 | Schulman et al. ............ 607/63 |
| 6,213,934 B1 | * | 4/2001 | Bianco et al. ................ 600/14 |
| 6,266,561 B1 | * | 7/2001 | Gliner ........................... 607/5 |

* cited by examiner

Primary Examiner—John Barlow
Assistant Examiner—Meagan S Walling
(74) Attorney, Agent, or Firm—Greer, Burns & Crain, Ltd.

(57) ABSTRACT

Apparatus for testing an electronic device under a plurality of test conditions created during a test sequence includes an arbitrary waveform generator that sequentially generates the plurality of test conditions. The test conditions include selectively forcing voltage or forcing current over a wide range of amplitudes, measuring a plurality of results with various resolutions and at selected times during the test sequence, changing filter settings, gains and other parameters. The test conditions are selected and set under the control of a system clock using data stored in memory. A controller initiates the test sequence of the apparatus and determines whether measured results are within predetermined specifications. The controller uses processor-driven software, but the settings of the test apparatus are changed at predetermined times during the test sequence, without controller intervention. Several test apparatus are typically managed by one controller. Performing test sequences without controller intervention reduces the time required for testing.

16 Claims, 7 Drawing Sheets

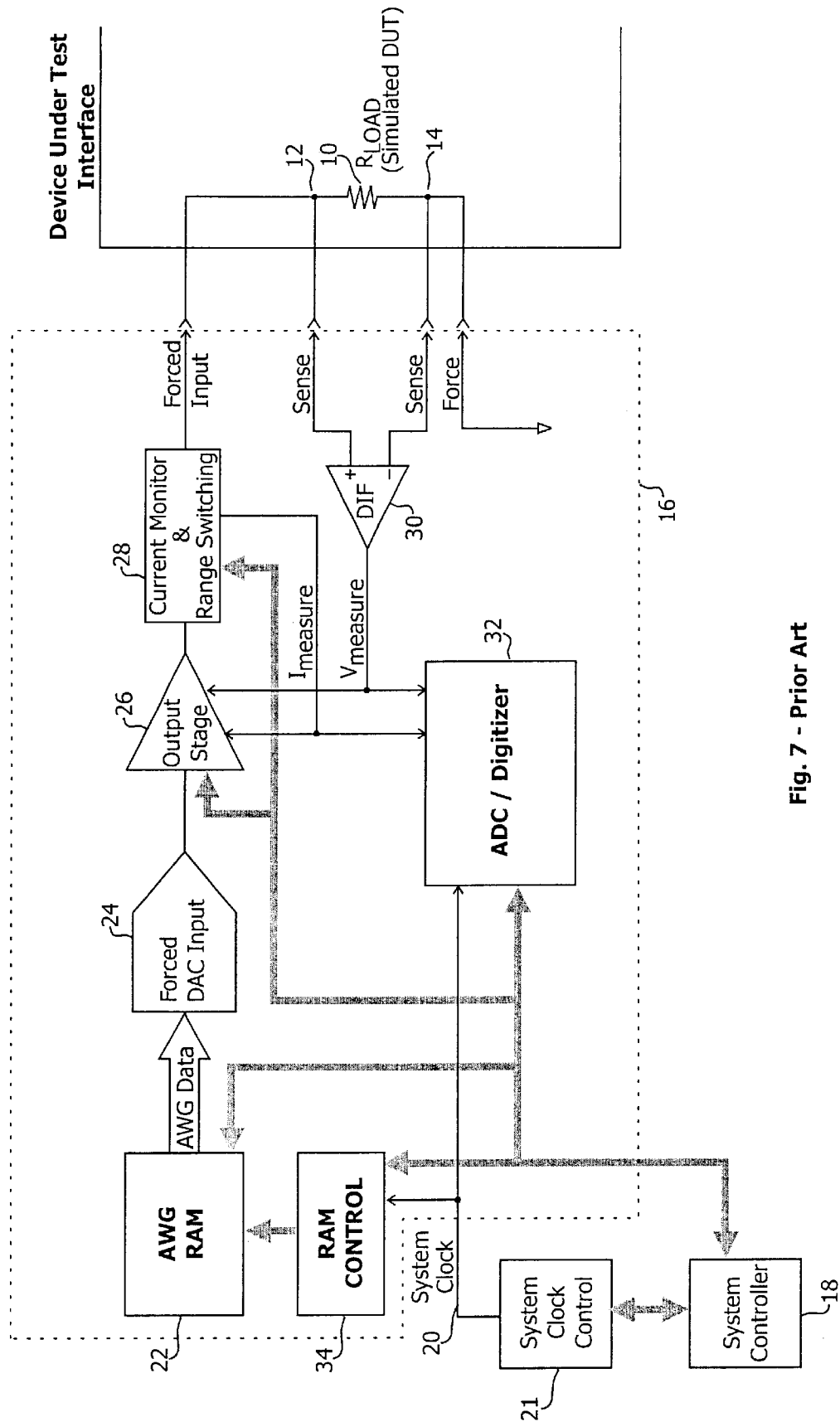
Fig. 7 - Prior Art

METHODS AND APPARATUS FOR TESTING ELECTRONIC DEVICES

This invention relates to methods and apparatus for testing electronic devices, and more particularly, to electronic device testers that automatically change force conditions and measurement settings on the fly in the course of a test sequence, without system controller intervention.

BACKGROUND OF THE INVENTION

When testing electronic devices such as voltage regulators and other circuits, it is desirable to test the devices under a variety of test conditions. When testing voltage regulators, for example, it is desirable to apply or force a series of different input voltages to the voltage regulator under test, and/or load the devices to produce a variety of forced output currents, and measure the output voltage to determine whether the device performs within specifications. Input parameters can also be measured, if desired. For example, if a constant input voltage is provided to the device, the input current can be measured as a test of device performance. In any event, it is desirable to test not only steady state device performance, but performance under transient conditions, as well. Of course, the entire series of tests must be performed as quickly as possible, preferably in an automated manner.

Known apparatus for testing electronic devices automatically performs a sequence of tests by forcing different inputs to devices under test and measuring various responses from those inputs. A computer initiates the test sequence and changes various measurement parameters during the test sequence, using processor driven software in the computer. The computer typically controls a plurality of test apparatus.

An example of such apparatus is shown in FIG. 7. In FIG. 7, a device under test (DUT) 10, shown as a resistive load, has two terminals 12, 14 for connection to test apparatus 16. The test apparatus 16 is controlled by a system controller 18, such as a personal computer or the like. Clock signals 20 are provided to synchronize the test apparatus 16 with other test apparatus in the system (not shown) through a system clock controller 21.

The test apparatus 16 includes an arbitrary waveform generator (AWG) RAM 22. The AWG RAM 22 generates data representing a series of conditions under which the DUT 10 is tested. The data is converted to a desired analog waveform in a digital to analog converter (DAC) 24. The DAC 24 produces the test conditions as forced inputs that pass through an output stage 26 and a current monitor and range switching circuit 28 to the DUT 10. The forced input to the DUT 10 can be a voltage or a current that changes in amplitude perhaps many times during a test sequence.

The voltage response of the DUT 10 to the test conditions is sensed by a differential amplifier 30. In FIG. 7, the differential amplifier 30 measures the voltage across the DUT 10 when the forced input is applied, and the current monitor and range switching circuit 28 senses the current drawn by the DUT 10. The measurements are provided to an analog-to-digital converter/digitizer (ADC) 32. The digital data produced by the ADC 32 is provided to the system controller 18, which processes the test data gathered through the entire test sequence, and determines whether the DUT 10 meets the test specifications for the device.

The waveform data generated by the AWG RAM 22 to create the forced input is produced as a Random Access Memory (RAM) controller 34 counts through a predetermined number of steps under the control of the system clock signal 20. The RAM controller 34 generates addressing information for the AWG RAM 22. The RAM controller 34 is initially loaded with a start address from the system controller 18, and automatically increments the AWG RAM addresses on the fly, without intervention by processor driven software in the system controller 18.

In this known apparatus, test equipment measurement settings are made by the system controller 18, using processor-driven software. Changing test equipment settings in this manner is relatively slow and time consuming, particularly if one system controller is shared by several test apparatus set-ups. Since several setting changes might be needed within a single test sequence, this processing increases the time required for testing the device.

Another feature of the known apparatus is the operation and accumulation of data in the ADC 32. For example, the ADC 32 operates continuously whenever system clock signals 20 are provided, so a good deal of unneeded data is generated and must be processed which is time-consuming. Also, multiple test readings are sometimes stored in the ADC 32 and transferred to the system controller in blocks for processing. This process further slows the test sequence due to the time required for data transfer, which also increases the time required for testing the device.

Accordingly, one object of this invention is to provide new and improved apparatus for testing electronic devices.

Another object is to provide new and improved electronic device testers that reduce the time required for testing.

SUMMARY OF THE INVENTION

In keeping with one aspect of the invention, apparatus for testing an electronic device under a plurality of test conditions created during a test sequence includes an arbitrary waveform generator that sequentially generates various forced voltage or forced current waveforms. The arbitrary waveform generator is controlled by data stored in an associated memory. The memory also includes data that selects a forced voltage mode or a forced current mode for the generator, and can change the maximum current producing capability or current range of the generator.

One or more measuring devices store a plurality of results during the test sequence using a series of range and other settings. The settings of the measuring devices are selected and set using data stored in memory, preferably the memory used by the arbitrary waveform generator.

A controller initiates the test sequence and determines whether measured results are within predetermined specifications. The controller uses processor-driven software, but the settings of the measuring devices and/or the maximum current range of the generator are changed at predetermined times during the test sequence, without using the controller's processor-driven software. It is contemplated that not all settings need be changed without controller intervention, to practice the invention. The data can also be used to turn the measuring devices on and off during the test sequence, if desired, in a similar manner.

In another aspect of the invention, at least one of the measuring devices makes sets of sample measurements over a period of time. The samples are added independently of the controller, and the controller divides the total by the number of samples taken, to calculate the average result.

BRIEF DESCRIPTION OF THE DRAWINGS

The above mentioned and other features of this invention and the manner of obtaining them will become more apparent, and the invention itself will be best understood by reference to the following description of the invention taken in conjunction with the accompanying drawings, in which:

FIG. 7 is a block diagram of a conventional test system.

DETAILED DESCRIPTION

Figure 1:
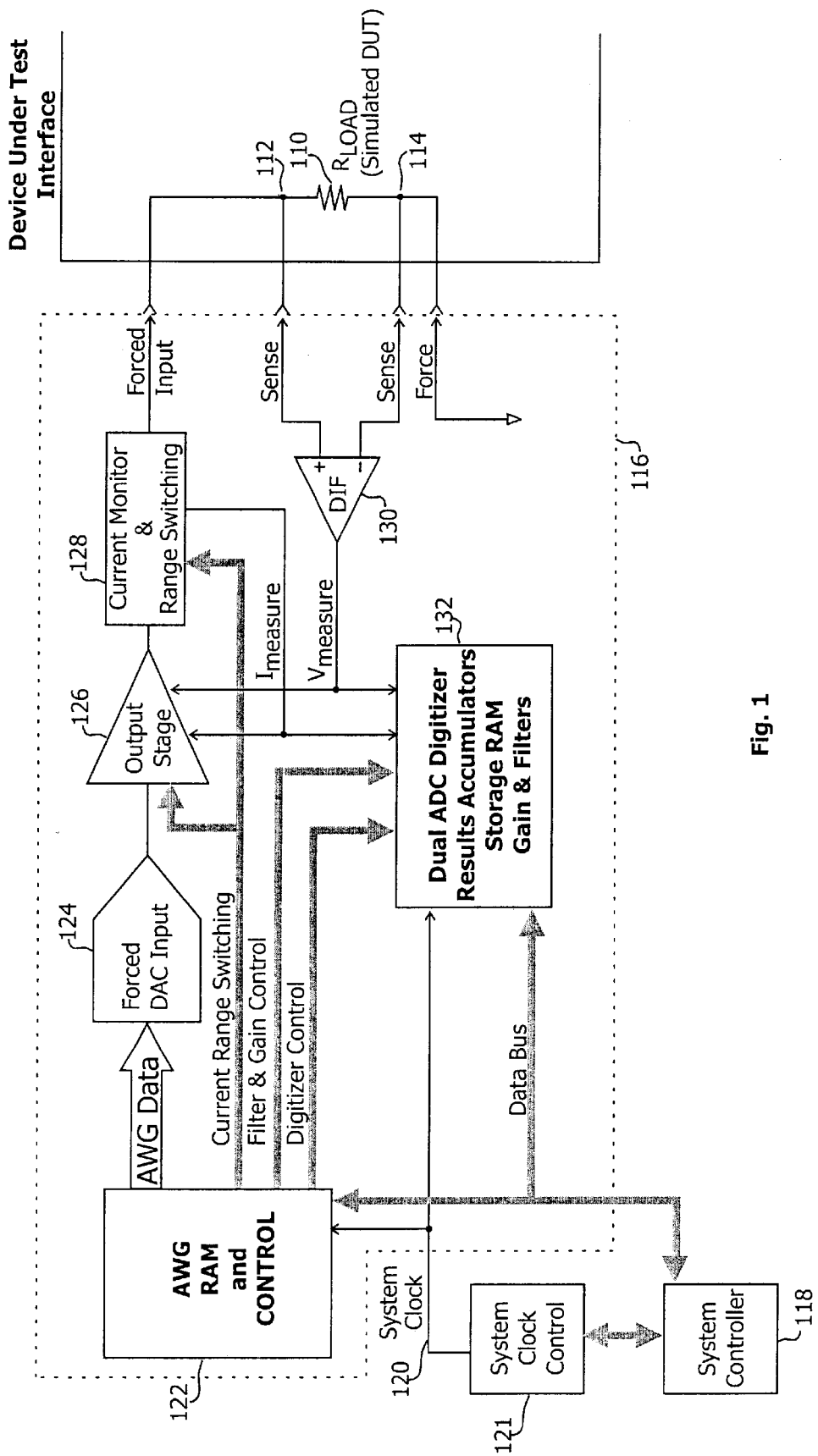
FIG. 1 is a block diagram of a test system made in accordance with the present invention.

As seen in FIG. 1, a device under test (DUT) 110 includes terminals 112 and 114. The DUT 110 is shown as a resistor, but can be any electronic component or device, such as a voltage regulator or other circuit. The DUT 110 can have several terminals that perform a variety of functions, such as input terminals, output terminals, control terminals, power supply terminals, ground terminals, etc.

The DUT 110 is connected to test apparatus 116. The test apparatus 116 is initialized by a system controller 118, and stepped through a test sequence by system clock signals 120. The system clock signals 120 are controlled by a system clock controller 121, which in turn is controlled by the system controller 118. The test apparatus 116 includes an arbitrary waveform generator (AWG) RAM controller 122 that feeds data to a digital-to-analog (DAC) converter 124 to generate a forced input signal. The input signal can be a forced voltage or a forced current. The output of the DAC 124 is fed to an output stage 126, and the output of the stage 126 is fed to a current monitor and range switching circuit 128 that produces the forced input for the DUT 110.

The voltage across the DUT 110 is a result that is measured or sensed by a differential amplifier 130. The output of the differential amplifier 130 is a voltage measurement that is fed to the output stage 126 and an analog-to-digital converter/digitizer 132. The digitizer 132 processes the measured voltages, converts the results from analog to digital, and stores the results, which are read by the system controller 118. The digitizer 132 is also capable of measuring the current flow in the forced input signals, as sensed by the current monitor and range switching circuit 128.

The random access memory in the AWG RAM controller 122 stores instructions which cause the AWG RAM controller 122 to generate data for sequentially generating a plurality of test conditions during a test sequence. The RAM also stores data which changes settings of the output stage 126, the current monitor/range switching circuit 128, and the ADC digitizer 132. Forced inputs can be changed between forced voltage and forced current on the fly using data in the RAM. RAM data can also be used to gate the ADC digitizer 132 on and off and change gain and filter settings. The gain of the differential amplifier 130 can be effectively controlled by adjusting the settings of the digitizer 132. The gain of the amplifier 130 could also be controlled directly from the AWG RAM controller 122, if desired. In this manner, many parameters can be changed on the fly, without intervention by the system controller 118. Changing even a limited number of parameters without controller intervention reduces the time required for testing.

The current monitor/range switching circuit 128 can be used to measure the current drawn by the DUT 110. The measured current is fed to the output stage 126 and the digitizer 132. In order to measure the current to a desired degree of accuracy, the range of the circuit 128 can be changed by the AWG RAM controller 122. It is contemplated that voltage ranges could be changed in a similar manner, if desired, to obtain desired voltage resolution.

As various settings are sequentially selected using the data stored in the AWG RAM controller 122, various results are measured by the current monitor/range switching circuit 128 and the differential amplifier 130. Of course, additional measuring circuits could be provided for more complex designs, as needed.

Figure 2:
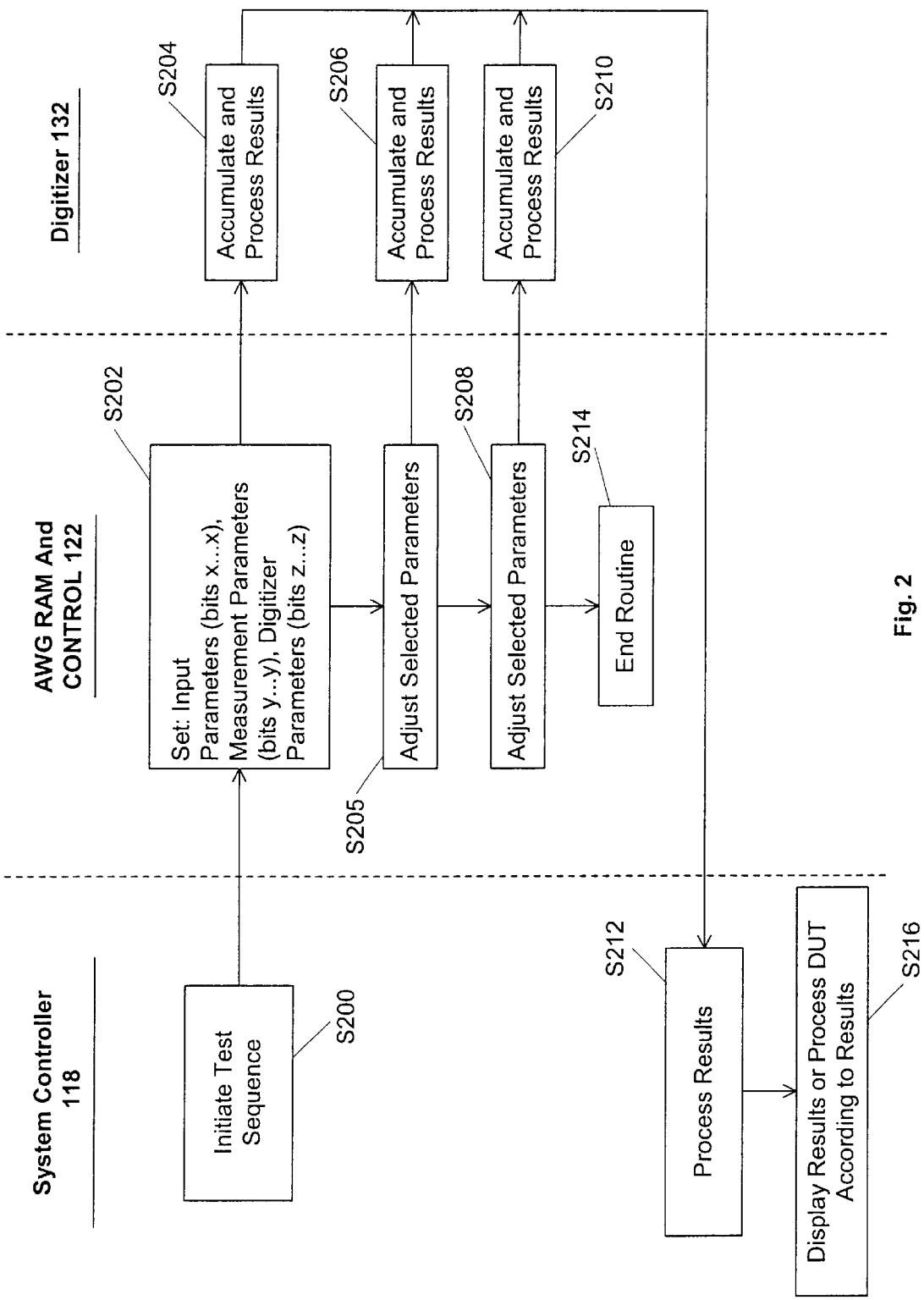
FIG. 2 is a state chart showing the overall operation of the system of FIG. 1.

The overall operation of the apparatus is shown in more detail in FIG. 2. The system controller 118 initiates a test sequence at S200 by starting the system clock signals, which run a previously loaded routine in the AWG RAM controller 122. In accordance with the stored routine, the bits x . . . x are used to set input parameters such as input voltage bits, bits y . . . y are used to set parameters such as output mode/forced voltage or forced current, and current ranges for both maximum current output and current measurement, and bits z . . . z are used to set digitizer parameters, such as measurement ranges, gains and filter parameters (S202). The bits can be allocated in any desired manner.

When the parameters are set, the digitizer 132 can take, accumulate, and process appropriate measurements at S204, under the control of the AWG RAM controller 122. Selected parameters are changed at S205, and the results produced for both maximum current output and current measurement are accumulated at S206. While a test sequence might include only one parameter change without controller intervention, virtually any desired number of parameter adjustments can be made in this manner, shown as S208, with results accumulated accordingly at S210. The results are read by the system controller 118 and processed at S212.

When the test sequence is completed at S214, the system controller 118 can display results or process the device under test according to the results at S216. In other words, an operator can be informed of the test results, or the DUT can be removed from the apparatus and placed in a bin or other location depending on whether the device passed or failed the test.

The AWG RAM controller 122 may be structured in many ways. For example, in a 32 bit RAM, 16 bits can be used to control the AWG RAM controller 122, and the other 16 bits can control the other functions. In this manner, the settings of the measuring devices are changed at predetermined times during the test cycle, using the data stored in the RAM controller 122, without using processor-driven software in the system controller 118. It is also contemplated that a digital signal processor or other device could be used with or in place of the AWG RAM controller 122.

Figure 3:
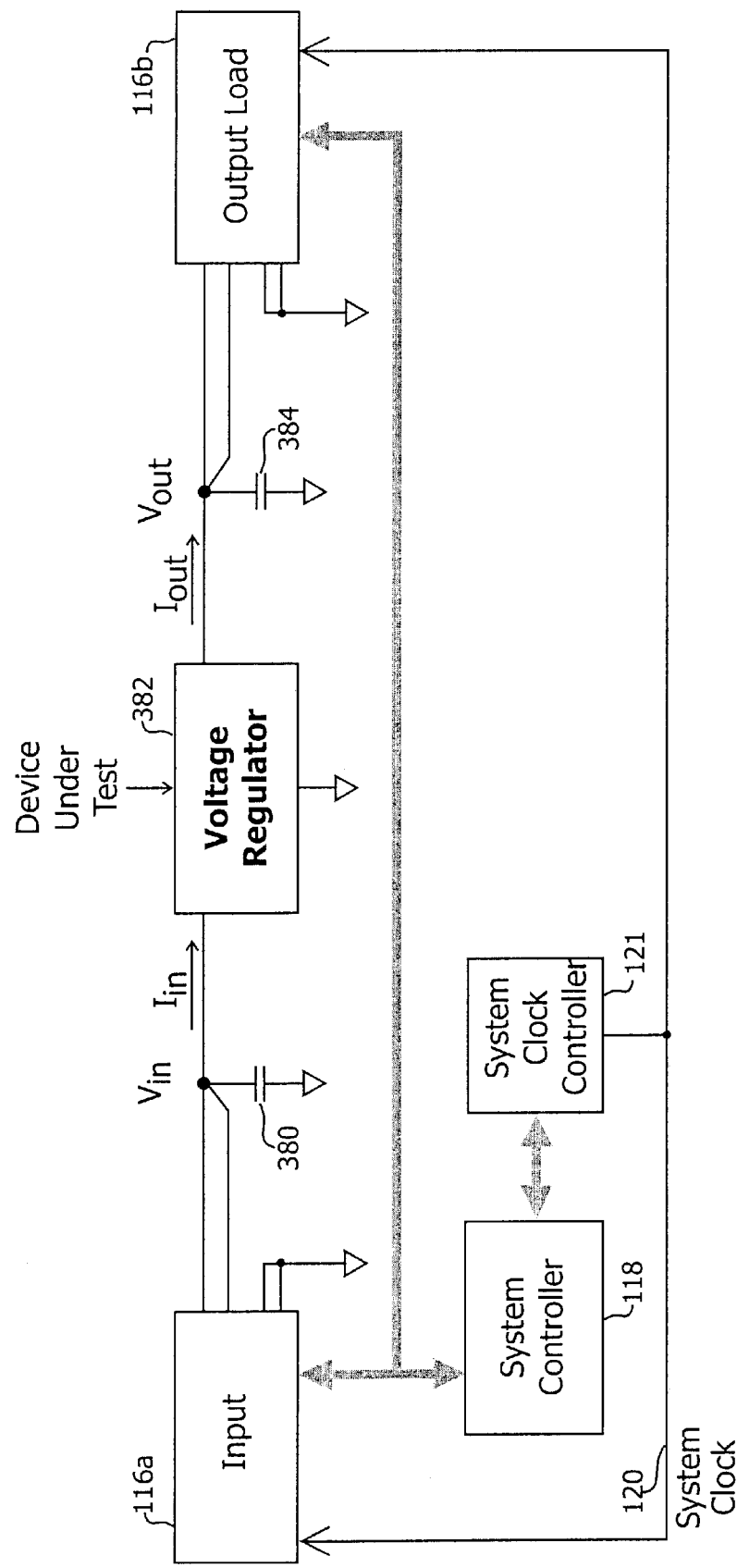
FIG. 3 is a block diagram describing apparatus for conducting an exemplary test using the apparatus of FIG. 1.

A test system using this invention on a voltage regulator is illustrated in FIG. 3. In this test, a capacitor 380 is placed across the input of a voltage regulator 382, and another capacitor 384 is placed across the output of the voltage regulator 382. One test apparatus 116a controls the input voltage (and could control the input current, if desired) to the voltage regulator 382. Another test apparatus 116b controls the output of the voltage regulator 382. The test apparatus 116a and 116b are sequenced synchronously by the system clock controller 121, which in turn is managed by the system controller 118.

The test apparatus 116 can operate in four quadratures, namely positive voltage/positive current, positive voltage/ negative current, negative voltage/positive current, and negative voltage/negative current. In other words, the test apparatus 116 can operate as a voltage/current source, or voltage/current sink (or load) in a known manner. In FIG. 3, then, the test apparatus 116b operates in the positive voltage/ negative current quadrature, to act as an output load for the voltage regulator 382. The test apparatus 116b can be changed as desired, to draw different currents $I_{out}$ from the voltage regulator 382.

The test apparatus 116a and 116b are the same as the test apparatus 116 in FIG. 1. Input waveforms are provided by the test apparatus 116a, through its AWG RAM controller 122, DAC converter 124, and output stage 126. If $V_{in}$ is forced, input current is measured by the test apparatus 116a, particularly its current monitor/range switching circuit 128, the amplifier 130 and the digitizer 132, as controlled by data in its AWG RAM controller 122. The test apparatus 116b can also force $I_{out}$ and measure $V_{out}$.

Figure 4:
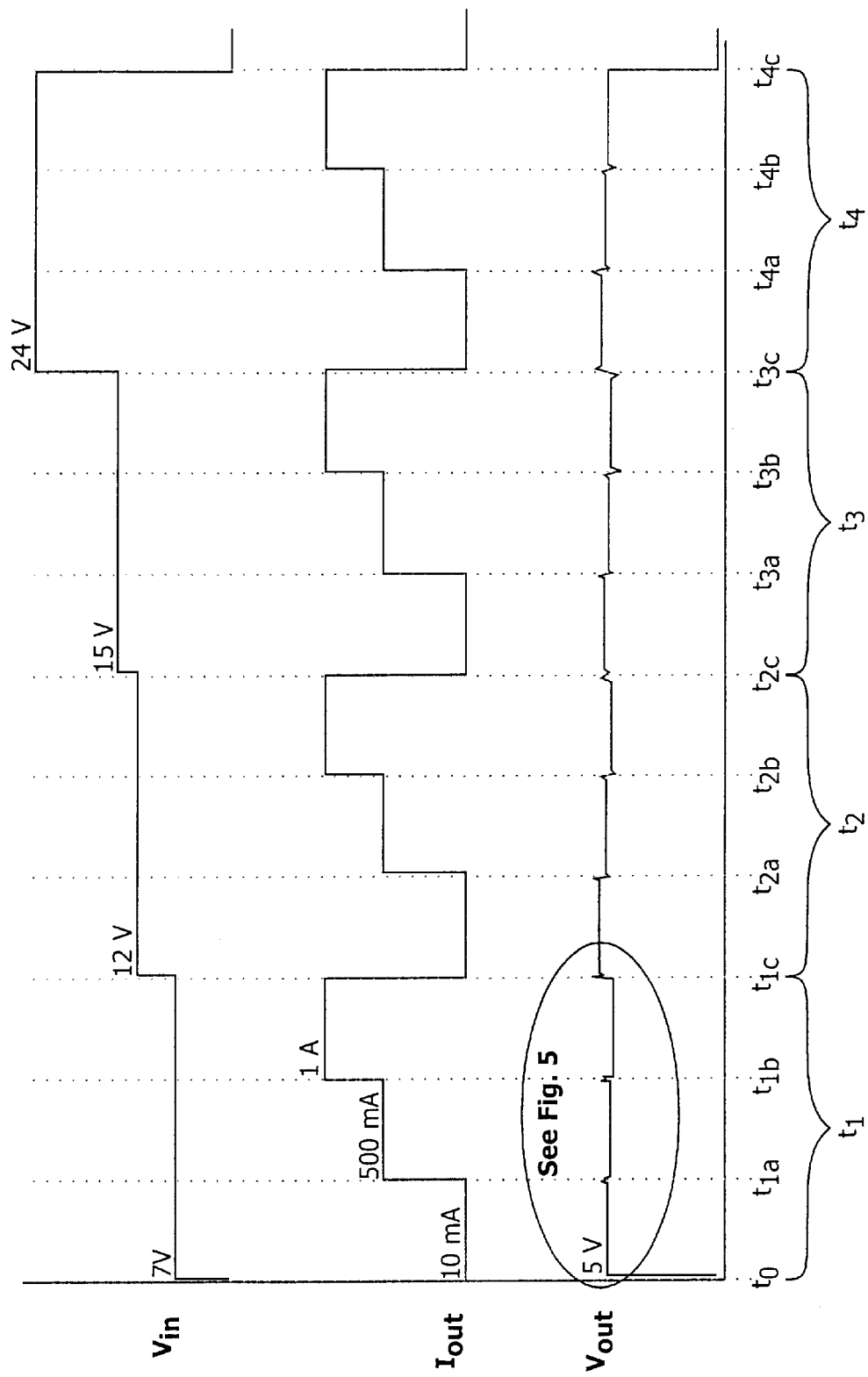
FIG. 4 is a timing chart used to describe a typical test sequence for the apparatus of FIG. 3.

An example of a test sequence for the voltage regulator 382 is shown in FIG. 4. In this example, the voltage regulator 382 is rated to produce a constant 5 volt output with an output current between 0 and 1 amp, when provided with a voltage input from +7 volts to +24 volts.

The forced input $V_{in}$ generated by the AWG RAM controller 122 is 7 volts from $t_0$ to $t_{1c}$ ($t_1$), 12 volts from $t_{1c}$ to $t_{2c}$ ($t_2$), 15 volts from $t_{2c}$ to $t_{3c}$ ($t_{3c}$), and 24 volts from $t_{3c}$ to $t_{4c}$ ($t_4$). The load on the output of the voltage regulator is changed using data in the AWG RAM controller 122 of the output test apparatus 116b, to force the output current $I_{out}$ of the voltage regulator to be 10 ma from $t_0$ to $t_{1a}$, 500 ma from $t_{1a}$ to $t_{1b}$, and 1A from $t_{1b}$ to $t_{1c}$. That pattern is repeated during times $t_2$, $t_3$ and $t_4$.

Figure 5:
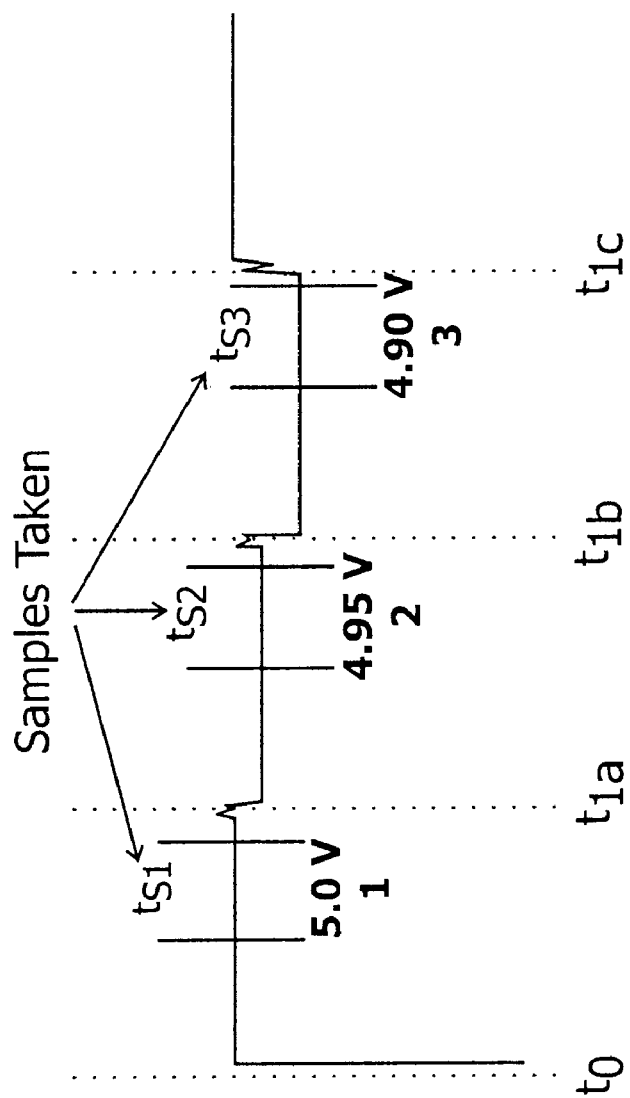
FIG. 5 is an expanded view of a portion of the timing chart of FIG. 4.

While the output voltage $V_{out}$ is theoretically a constant 5 volts, the output voltage varies in reality, as seen in FIG. 5, which is an expanded view of the measured output between time $t_0$ and time $t_{1c}$ in FIG. 4. In this example, the steady state output of the voltage regulator is 5.0 volts during the interval $t_{S1}$, 4.95 volts during the interval $t_{S2}$, and 4.90 volts during the interval $t_{S3}$, reflecting changes in $I_{out}$.

A number of samples can be taken in each sample interval $t_{S1}$, $t_{S2}$ and $t_{S3}$. Sampling in this manner avoids the effects of random noise from various sources that can cause the variance of a single sample to exceed a required accuracy or repeatability level. FIG. 5 reveals that the output voltage has a transient response every time the output current is changed. In this example, the transients are not measured, and only the steady state voltage is measured during time intervals $t_{S1}$, $t_{S2}$, and $t_{S3}$. To accomplish this, $V_{out}$ in FIGS. 4 and 5 is sampled only in specific places by using perhaps two bits in the AWG RAM controller 122 to control the digitizer 132, those two bits turning the digitizer on and off at specific places within the test sequence. Sampling only during predetermined time intervals also avoids taking unnecessary samples, which reduces data movement and processing time.

If desired, the samples taken during the sample periods $t_{S1}$, $t_{S2}$, and $t_{S3}$ can be summed and/or averaged. The digitizer 132 can sum, average and otherwise process the measurement result with appropriate internal processing capability. For summing, the digitizer 132 has a built-in measurement accumulator feature that allows it to sum the samples on the fly. Each time the digitizer 132 is turned off, it automatically stores the sum value of the last sample set. When it is turned on again, it sums the next sample set. With this feature, it is possible to store multiple readings. In the example shown in FIGS. 3 and 4, twelve output measurements are stored in the digitizer's memory, along with each sample point. After the test sequence is complete, the system controller reads back just the twelve summed readings. These readings are then each divided by the number of samples and compared to individual test limits to determine the acceptability of each test result.

Figure 6:
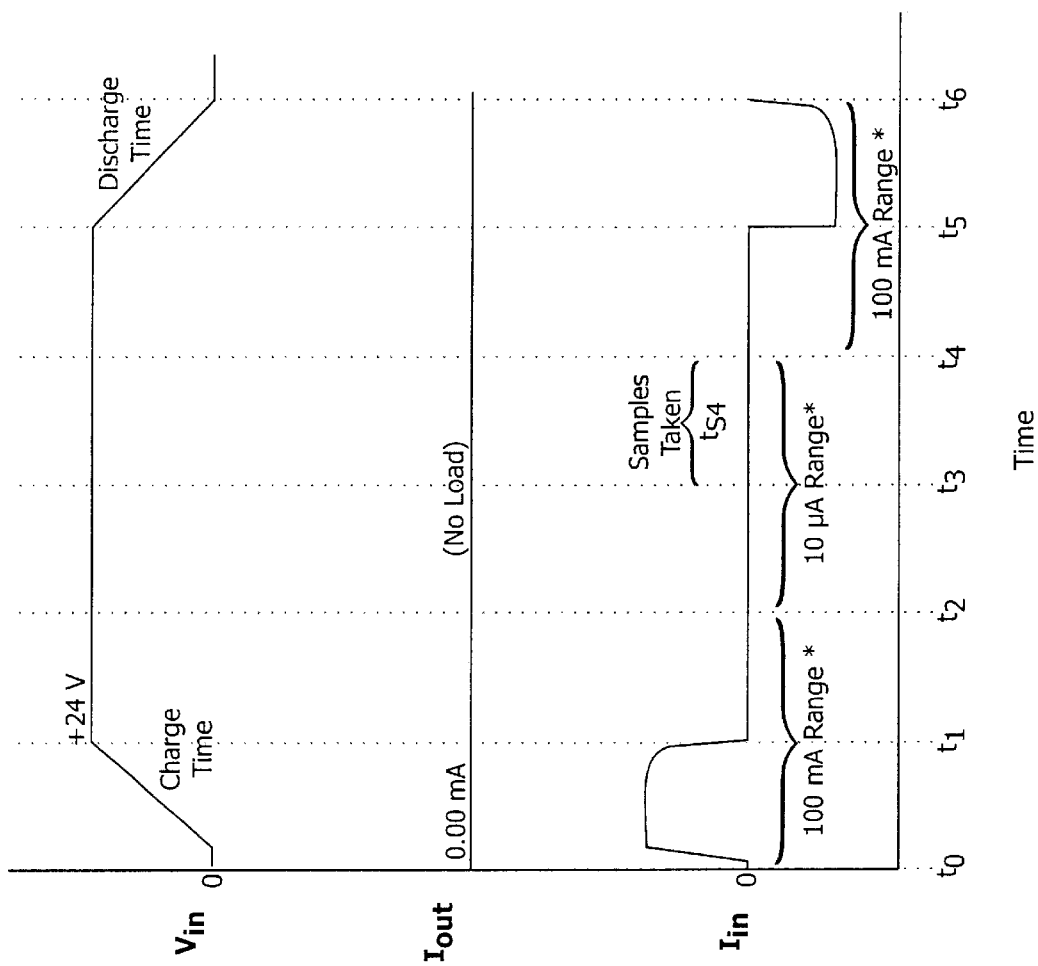
FIG. 6 is a timing chart used to describe another typical test sequence for the apparatus of FIG. 3.

Another sample test sequence for the voltage regulator 382 is shown in FIG. 6. In this example, there is no load on the voltage regulator. A forced input of 24 volts is applied at time $t_0$. Because the capacitor 380 is not charged, however, the input $V_{in}$ seen at the voltage regulator 382 is initially 0 volts, and does not reach 24 volts until the capacitor 380 is charged, at time $t_1$. During that time, the current drawn from the input (measured input $I_{in}$) starts at 0, and goes high, and returns to a very low level at time $t_1$. To draw this current quickly, the series resistance used to measure the current monitor/range switching circuit 128 is reduced to a resistance useful for measuring current in the 100 mA range. The steady state current draw is low after the capacitor charges because there is no load on the voltage regulator, i.e., the output $I_{out}$ is 0.00 mA. To measure the low current, the resistance in the circuit 128 is increased to accurately measure currents in the 10 μA range. If the forced voltage input $V_{in}$ is returned to 0.0 volts at time $t_5$, the capacitor 380 discharges, producing a negative current in the apparatus 116 from time $t_5$ to time $t_6$. To discharge the capacitor quickly, the resistance in the circuit 128 is again reduced to the resistance used for the 100 mA range.

The current drawn at the input can be measured during a sample time $t_{S4}$ to determine whether the voltage regulator 382 is operating properly. The AWG RAM controller 122 turns the digitizer 132 on at time $t_3$, and turns it off at time $t_4$. In addition, one or more control bits in the AWG RAM controller 122 change the range of the current monitor and range switching circuit 128 from a 100 ma range from time $t_0$ to time $t_2$, to a 10 microamp range from time $t_2$ to time $t_4$, and a 100 ma range from time $t_4$ to time $t_6$, as just explained. Samples could be taken during all of these times, if desired, although in this example they are only taken during time $t_{S4}$. In this manner, the current ranges are changed on the fly, without the system controller 118. Of course, the sample times, i.e., the times when the digitizer 132 is on, are also controlled by the AWG RAM controller 122, without intervention by the system controller 118.

The digitizer 132 has a number of programmable features that can be changed on the fly using control bits in the AWG RAM controller 122. One digitizer channel can be dedicated to voltage measurement, and another channel can be dedicated to current measurement. Each channel can have independent pattern control of its gain settings (1×, 10×, 100×), and filter selection. Changing the gain of the digitizer 132 improves measurement resolution without changing the range of the circuit 128. The ability to change measurement ranges in this manner without changing the maximum current range means that there is no disturbance to the forced voltage or forced current loop. This saves test time by avoiding possible loop resettling time. The selectable filters are valuable to provide bandwidth reduction and/or rejection of undesired signals. This reduces the number of samples required to achieve a desired repeatability, and thus saves test time.

The digitizer 132 can have processing capability and memory sufficient to accumulate results. The results accumulator is retriggerable, and is useful for storing multiple measured results in a data reduced fashion. For example, if a measurement requires as many as 100 sample points to achieve an acceptable measurement variability, and 10 such measurements are made consecutively, the digitizer would have to store 1000 data points in ten 100 sample groups. The retriggerable results accumulator would provide, in addition to the 1000 sample points, ten averaged answers corresponding to each of the ten sample sets. The system controller can then read back just the ten averaged answers, reducing data movement and post-processing time.

The complexity of the results accumulator can be reduced further by simply totaling the result of each analog-to-digital conversion locally in the digitizer 132 (sample 1, plus sample 2, plus sample 3, etc.). The summation of the samples can be passed to the system controller 118 and divided by the number of samples, which is fast, and avoids the need to do floating point arithmetic in the digitizer 132.

The system controller 118 initiates a test sequence, and determines whether the measured parameters are within predetermined specifications. The system controller 118 could be a personal computer, for example, and could be connected to several test apparatus 116. By remotely controlling the test sequences in the various test apparatus 116, many devices can be tested simultaneously, with little loss of efficiency due to system controller intervention. Measured results can be sent to the controller 118 in blocks, to further reduce processing overhead.

The many advantages of this invention are now apparent. Testing time is reduced significantly using one or more features of this invention, including force voltage to force current and force current to force voltage changes on the fly, current and voltage range changes on the fly, sampling data at particular times on the fly, and programming digitizer gains and filters on the fly, each of which avoids controller intervention. The retriggerable results accumulator also reduces test time by averaging multiple sample sets independently within a single test sequence without system controller intervention, or summing several samples so an average can easily be obtained by the controller.

While the principles of the invention have been described above in connection with specific apparatus and applications, it is to be understood that this description is made only by way of example and not as a limitation on the scope of the invention.

What is claimed is:

1. Apparatus for testing an electronic device under a plurality of forced test conditions created during a test sequence, the apparatus being managed by a controller that initiates the test sequence and determines whether measured results are within predetermined specifications, the apparatus comprising:
    means for sequentially forcing the plurality of test conditions; and
    means for measuring a plurality of results during the test sequence, by sequentially using a series of settings, the settings of the measuring means being selected and set without controller intervention:
        wherein at least some forced test conditions are selected and set without controller intervention, and the forced conditions are generated by an arbitrary waveform generator controlled by data in a memory, the measurement settings being set by other data in the memory.

2. The apparatus of claim 1 wherein the measuring means includes an amplifier that measures voltage across the electronic device.

3. The apparatus of claim 1 wherein the measuring means includes a current monitor, and one of the settings is a current range of the current monitor.

4. The apparatus of claim 1, wherein the measuring means includes a digitizer having at least one channel for voltage measurement, wherein one of the settings is a voltage range.

5. The apparatus of claim 1, wherein the measuring means includes a digitizer, the digitizer having at least one channel dedicated to current measurement, wherein one of the settings is a current range.

6. The apparatus of claim 1, comprising a results accumulator for adding a plurality of measured results to obtain a sum, wherein the controller divides the sum by the number of measured results to obtain an average result.

7. The apparatus of claim 1, comprising a results processor for processing a plurality of measured results, to provide the processed measured results to the controller, which determines whether the processed measured results are within the predetermined specifications.

8. Apparatus for testing an electronic device under a plurality of forced test conditions created during a test sequence, the apparatus being managed by a controller that initiates the test sequence and determines whether measured results are within predetermined specifications, the apparatus comprising:
    means for sequentially forcing the plurality of test conditions, the forced test conditions being selected and set without controller intervention; and
    means for measuring a plurality of results during the test sequence; wherein the forced conditions are generated by an arbitrary waveform generator controlled by data in a memory.

9. The apparatus of claim 8 wherein the plurality of forced test conditions are selected and set by the data stored in memory.

10. Apparatus for testing an electronic device under a plurality of forced test conditions created during a test sequence, the apparatus being managed by a controller that initiates the test sequence and determines whether measured results are within predetermined specifications, the apparatus comprising:
    means for sequentially forcing the plurality of test conditions; and
    means for measuring a plurality of results during the test sequence, by sequentially using a series of settings, the settings of the measuring means being selected and set without controller intervention;
    wherein the measuring means includes a digitizer, the digitizer having at least one filter for providing bandwidth reduction and/or rejection of undesired signals, and one of the settings is filter selection.

11. Apparatus for testing an electronic device under a plurality of forced test conditions created during a test sequence, the apparatus being managed by a controller that initiates the test sequence and determines whether measured results are within predetermined specifications, the apparatus comprising:
    means for sequentially forcing the plurality of test conditions; and
    means for measuring a plurality of results during the test sequence, by sequentially using a series of settings, the settings of the measuring means being selected and set without controller intervention;
    wherein the measuring means includes a digitizer, the digitizer being turned on and off at predetermined times during the test sequence.

12. Apparatus for testing an electronic device under a plurality of forced test conditions created during a test sequence, the apparatus being managed by a controller that initiates the test sequence and determines whether measured results are within predetermined specifications, the apparatus comprising:

means for sequentially forcing the plurality of test conditions; and means for measuring a plurality of results during the test sequence, by sequentially using a series of settings, the settings of the measuring means being selected and set without controller intervention;

wherein the measuring means includes a digitizer having at least one amplifier having a selectable gain, and wherein one of the settings is gain selection.

13. Apparatus for testing an electronic device under a plurality of forced test conditions created during a test sequence, the apparatus being managed by a controller that initiates the test sequence and determines whether measured results are within predetermined specifications, the apparatus comprising:

means for sequentially forcing the plurality of test conditions, the forced test conditions being selected and set without controller intervention; and means for measuring a plurality of results during the test sequence;

wherein one forced test condition is a forced voltage, and another forced test condition is a forced current, the sequential forcing means selectively forcing one or the other of the forced test conditions.

14. Apparatus for testing an electronic device under a plurality of forced test conditions created during a test sequence, the apparatus being managed by a controller that initiates the test sequence and determines whether measured results are within predetermined specifications, the apparatus comprising:

means for sequentially forcing the plurality of test conditions, the forced test conditions being selected and set without controller intervention; and means for measuring a plurality of results during the test sequence;

wherein the measuring means includes a current monitor that senses the current produced according to a selection of one of several current ranges, the sequential forcing means changing the range of the current monitor to produce a desired current output from the sequential forcing means.

15. Apparatus for testing an electronic device under a plurality of forced test conditions created during a test sequence, the apparatus being managed by a controller that initiates the test sequence and determines whether measured results are within predetermined specifications, the apparatus comprising:

means for sequentially forcing the plurality of test conditions, the forced test conditions being selected and set without controller intervention;

means for measuring a plurality of results during the test sequence; and a results accumulator for adding a plurality of measured results to obtain a sum, wherein the controller divides the sum by the number of measured results to obtain an average result.

16. The apparatus of claim 15, comprising a results processor for processing a plurality of measured results, to provide the processed measured results to the controller, which determines whether the processed measured results are within the predetermined specifications.

* * * * *